(12) United States Patent
Huffman et al.

(10) Patent No.: US 8,560,764 B2
(45) Date of Patent: Oct. 15, 2013

(54) REPURPOSING NAND READY/BUSY PIN AS COMPLETION INTERRUPT

(75) Inventors: Amber D. Huffman, Banks, OR (US);
Suryaprasad Kareenahalli, Folsom, CA (US); Robert J. Rover, Jr., Portland, OR (US); Chai Huat Gan, Penang (MY)

(73) Assignee: Intel Corporation, Santa Clara, CA (US)

( * ) Notice: Subject to any disclaimer, the term of this patent is extended or adjusted under 35 U.S.C. 154(b) by 465 days.

(21) Appl. No.: 12/643,131

(22) Filed: Dec. 21, 2009

(65) Prior Publication Data

US 2011/0153914 A1    Jun. 23, 2011

(51) Int. Cl.
*G06F 12/00* (2006.01)
(52) U.S. Cl.
USPC .................................. 711/103; 711/E12.069

(58) Field of Classification Search
USPC ........................................................ 711/103
See application file for complete search history.

(56) References Cited

U.S. PATENT DOCUMENTS

| | | | |
|---|---|---|---|
| 5,056,004 A * | 10/1991 | Ohde et al. | 712/241 |
| 7,385,851 B1 * | 6/2008 | Park et al. | 365/185.22 |
| 7,711,889 B2 * | 5/2010 | Kudo et al. | 711/103 |
| 2008/0301397 A1 | 12/2008 | Goh et al. | |
| 2009/0172466 A1 | 7/2009 | Royer | |

\* cited by examiner

*Primary Examiner* — Reginald Bragdon
*Assistant Examiner* — Hamdy S Ahmed
(74) *Attorney, Agent, or Firm* — Jordan IP Law, LLC

(57) ABSTRACT

A system and method of controlling a flash memory device such as a NAND memory device may involve receiving a command to execute an operation. A Ready/Busy contact of the memory device may be pulsed low in response to determining that execution of the operation has completed.

11 Claims, 2 Drawing Sheets

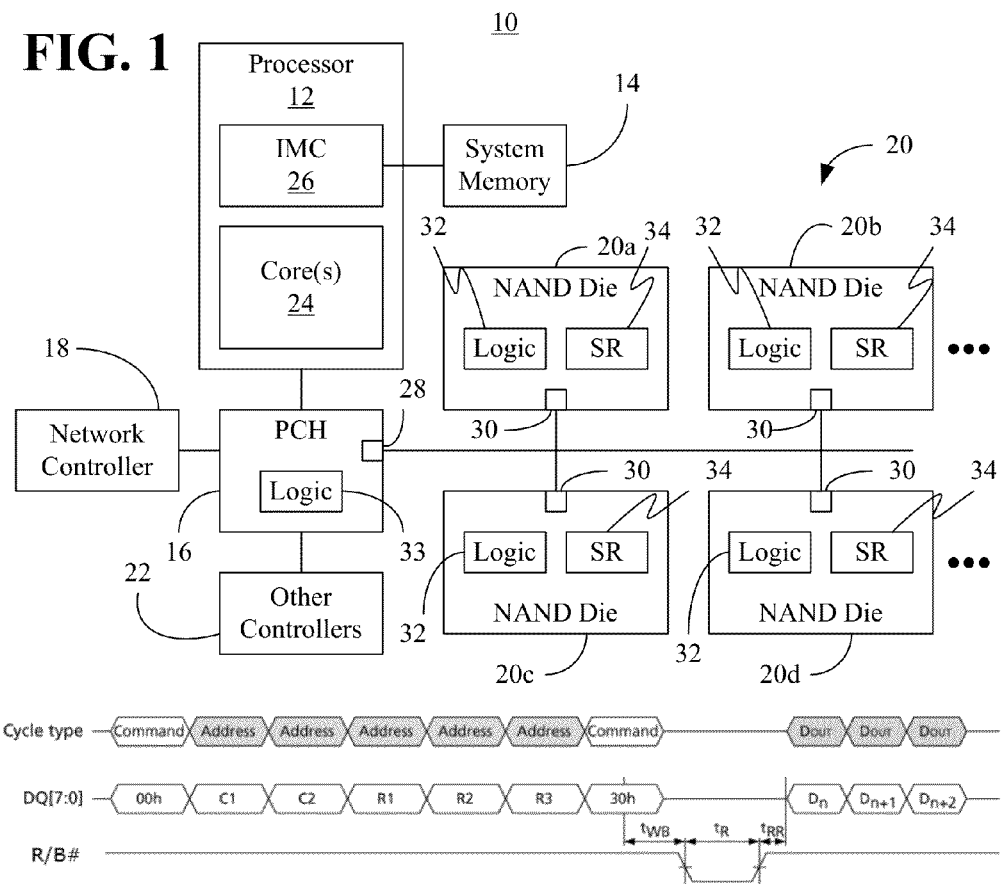
FIG. 1
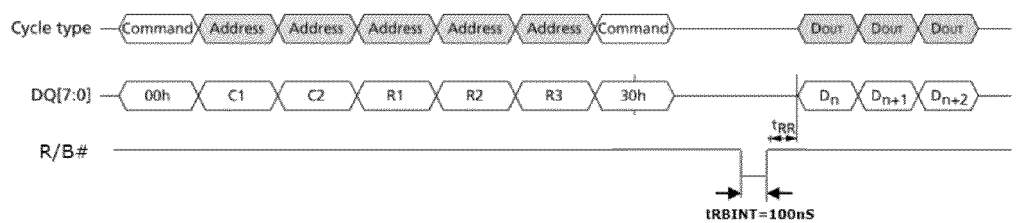
FIG. 3A
FIG. 3B

REPURPOSING NAND READY/BUSY PIN AS COMPLETION INTERRUPT

BACKGROUND

1. Technical Field

Embodiments generally relate to flash memory devices. More particularly, embodiments relate to the repurposing of a NAND memory device Ready/Busy contact as a completion interrupt.

2. Discussion

Computing systems typically store data to different types of storage media and devices. In certain cases, such as in high capacity data storage situations, multiple NAND flash chips may be coupled to a host device such as a chipset. The chipset can include a Ready/Busy (R/B#) input that is coupled to the R/B# pin of each of the NAND chips. For example, there might be two or four NAND chips sharing the same R/B# input to the chipset. If any of the NAND chips has a command in execution, then the R/B# input is typically pulled low. A particular challenge with such an approach may be that it is difficult to determine when a command has completed for a particular NAND chip, since the R/B# input remains low if commands are still outstanding for other chips that share that input. Accordingly, the chipset may need to poll the NAND chips with Read Status Enhanced commands in order to determine which commands have completed.

For example, the chipset might poll each NAND chip every microsecond or more to determine command completion. For a program command, the command completion time may be around 200 microseconds, but may vary widely. For an erase command, the completion time could be around two milliseconds and may also vary. These times can be 2× to 5× longer with multi-level cell NAND devices (i.e., devices with more than one bit per cell). One issue with polling is that the chipset may waste power (e.g., 200 mW in active state) when sending out Read Status Enhanced commands on such a frequent basis. Another issue can be performance loss. For example, polling for command completions every microsecond might cause commands to complete later (e.g., 500 ns) than they normally would.

BRIEF DESCRIPTION OF THE DRAWINGS

The various advantages of the embodiments of the present invention will become apparent to one skilled in the art by reading the following specification and appended claims, and by referencing the following drawings, in which:

FIG. 1 is a block diagram of an example of a computing system according to an embodiment;

FIG. 3A is a timing diagram of an example of a conventional execution of a command to perform a read operation; and FIG. 3B is a timing diagram of an example of execution of a command to perform a read operation according to an embodiment.

DETAILED DESCRIPTION

Figure 2:
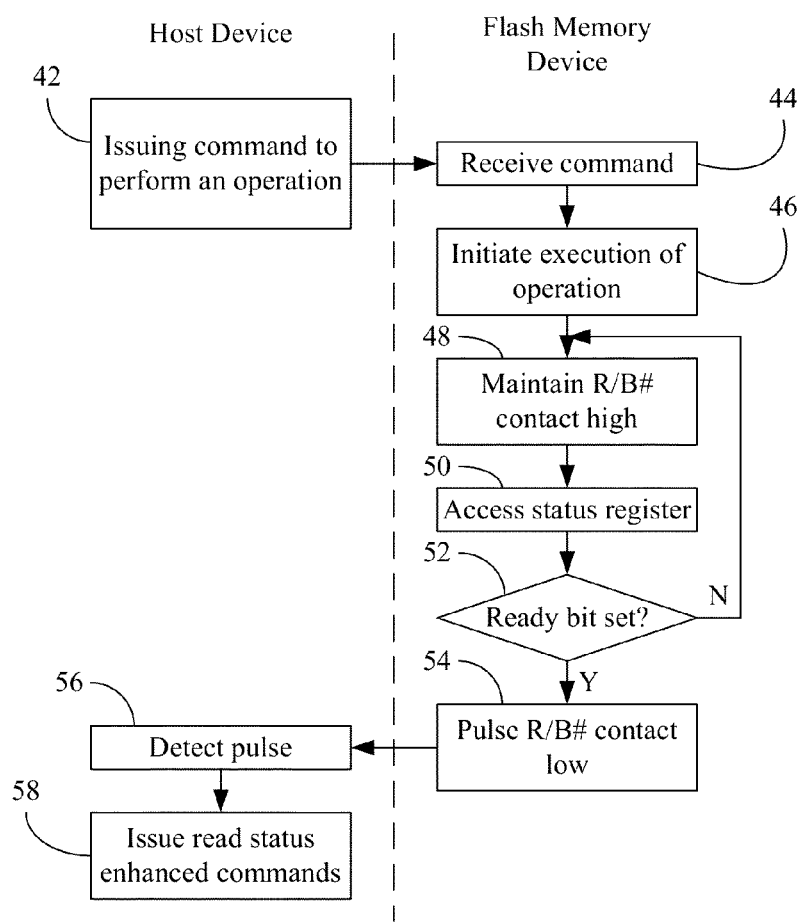
FIG. 2 is a flowchart of an example of a method of managing flash memory commands according to an embodiment.

Embodiments may provide for a method of operating a flash memory device in which a command to execute an operation is received. The method can also provide for determining that execution of the operation has completed, and pulsing a Ready/Busy (R/B#) contact of the memory device in response to determining that execution of the operation has completed.

Embodiments may also provide for a method of operating a host device in which a command is issued to perform an operation on one or more of a plurality of flash memory devices coupled to an R/B# contact of the host device. A pulse can be detected on the R/B# contact of the host device, and a Read Status Enhanced command may be issued to each of the plurality of memory devices in response to detecting the pulse.

Embodiments can also include a system having a plurality of NAND memory devices and a host device. Each NAND memory device may have an R/B# contact and memory logic to receive a command to execute an operation and determine that execution of the operation has completed. The memory logic can also pulse the R/B# contact of the memory device in response to determining that execution of the operation has completed. The host device may include an R/B# contact coupled to the R/B#contact of each NAND memory device, and host logic to detect the pulse on the R/B# contact of the host device. The host logic can also issue a Read Status Enhanced command to each of the plurality of NAND memory devices in response to detecting the pulse.

Turning now to FIG. 1, a computing system 10 is shown having a processor 12, system memory 14, a platform controller hub (PCH) 16, a network controller 18, a plurality of NAND memory devices such as NAND die/chips 20 (20a-20d), and various other controllers 22. The system 10 could be part of a mobile platform such as a laptop, personal digital assistant (PDA), wireless smart phone, media player, imaging device, etc., or any combination thereof. The system 10 may also be part of a fixed platform such as a personal computer (PC), server, workstation, etc. Thus, the processor 12 may include one or more processor cores 24 and an integrated memory controller (IMC) 26 configured to communicate with the system memory 14. The system memory 14 could include dynamic random access memory (DRAM) configured as a memory module such as a dual inline memory module (DIMM), a small outline DIMM (SODIMM), etc.

The illustrated PCH 16, sometimes referred to as a Southbridge of a chipset, functions as a host device and communicates with the network controller 18, which could provide off-platform communication functionality for a wide variety of purposes such as cellular telephone (e.g., W-CDMA (UMTS), CDMA2000 (IS-856/IS-2000), etc.), WiFi (e.g., IEEE 802.11, 1999 Edition, LAN/MAN Wireless LANS), Bluetooth (e.g., IEEE 802.15.1-2005, Wireless Personal Area Networks), WiMax (e.g., IEEE 802.16-2004, LAN/MAN Broadband Wireless LANS), Global Positioning System (GPS), spread spectrum (e.g., 900 MHz), and other radio frequency (RF) telephony purposes. The other controllers 22 could communicate with the PCH 16 to provide support for user interface devices such as a display, keypad, mouse, etc. in order to allow a user to interact with and perceive information from the system 10.

The NAND chips 20 might be used collectively as a solid state disk (SSD) or a cache memory in which high capacity data storage and/or a significant amount of parallelism may be desired. The NAND chips 20 could also be used as a USB (Universal Serial Bus, e.g., USB Specification 2.0, USB Implementers Forum) flash storage device. There may also be solutions that include NAND controllers implemented as separate application specific integrated circuit (ASIC) controllers being connected to the PCH 16 on other standard buses such as a Serial ATA (SATA, e.g., SATA Rev. 3.0 Specification, May 27, 2009, SATA International Organization/SATA-IO) bus, or a PCI Express Graphics (PEG, e.g., Peripheral Components Interconnect/PCI Express x16 Graphics 150W-ATX Specification 1.0, PCI Special Interest Group) bus. Accordingly, each NAND chip 20 may be configured to communicate with the PCH 16 according to a protocol such as the Open NAND Flash Interface (e.g., ONFI Specification, Rev. 2.2, Oct. 7, 2009) protocol, or other suitable protocol. In particular, each NAND chip 20 may include a Ready/Busy (R/B#) contact (e.g., pin, socket, ball, etc.) 30, memory logic 32 and a status register (SR) 34, where the NAND chips 20 could all share a Chip Enable (CE#) output of the PCH 16. In the illustrated example, the R/B# contact 30 of each NAND chip 20 is coupled to an R/B# contact 28 of the PCH 16.

The memory logic 32 may be configured to receive commands from the PCH 16 to execute operations such as program, read and erase operations on the NAND chip 20. Upon determining that execution of a particular operation has completed, the memory logic 32 can also pulse the R/B# contact 30 of the NAND chip 20 in response to determining that execution of the operation has completed. In particular, the memory logic 32 might determine that execution of the operation has completed by accessing the status register 34 of the NAND chip 20. In one example, accessing the status register 34 could return a byte value in a format such as the following format.

TABLE 1

| Value | 7 | 6 | 5 | 4 | 3 | 2 | 1 | 0 |
|---|---|---|---|---|---|---|---|---|
| Status Register | WP# | RDY | ARDY | VSP | R | R | FAILC | FAIL |

In the above example, if the ready bit (RDY) is set to one, then the NAND chip logical unit (LUN) or interleaved address is ready for another command and all other bits in the status value are valid. If RDY is cleared to zero, then the last command issued is not yet complete and SR bit 5:0 are invalid and may be ignored. When caching operations are in use, then RDY could indicate whether another command can be accepted, and the illustrated array ready bit (ARDY) indicates whether the last operation is complete. If ARDY is set to one, then there is no array operation in progress. If ARDY is cleared to zero, then there is a command being processed (RDY is cleared to zero) or an array operation is in progress. When overlapped interleaved operations or cache commands are not supported, ARDY may not be used. Pseudocode for behavior of the R/B# signal can be given by, if (StatusRegister[6] transitions from '0' to '1') then pulse R/B# low or if (StatusRegister[5] transitions from '0' to '1') then pulse R/B# low.

Various implementation variants of this feature may utilize only bit 6 of the status register (the Ready bit). Other implementations may also use bit 5 of the status register (the Array Ready bit). Indeed, an implementation may use both bits so that it is possible for the host device to know both events: a) when the NAND chip may accept a new command (StatusRegister[6] transitions high), and b) when an array operation has completed (StatusRegister[5] transitions high). Simply put, if either ready bit (e.g., RDY or ARDY) is set, the memory logic can pulse the R/B# contact in order to signal a completion interrupt to the PCH 16.

FIGS. 3A and 3B demonstrate that the R/B# contact, which is typically pulled low while an operation is being executed under conventional approaches, could instead be pulsed for a relatively short period of time upon completion of execution of the operation. In particular, FIG. 3A shows conventional scheme 36 in which a read command (30h) is issued and the R/B# contact of the NAND chip is pulled low for the time period $t_R$, which corresponds to the amount of time the NAND chip takes to execute the read operation. Typically, the time period $t_R$ could be on the order of 20-30 microseconds. Moreover, in an architecture in which multiple NAND chips are ganged together and connected to a common R/B# contact of the host device, the result may be that the host device's R/B# contact is held low perpetually and conveys little or no information to the host device.

Accordingly, FIG. 3B shows a revised scheme 38 in which the R/B# contact of the NAND chip is maintained high until execution of the read operation is completed, at which time the R/B# contact of the NAND chip is pulsed low. In alternative schemes, the R/B# contact might be maintained low and pulsed high. In the illustrated example, the pulse has a duration of 100 approximately nanoseconds, which is substantially shorter than the time period $t_R$ that corresponds to the approximately 20-30 microsecond completion time of a typical read command. The same is true with regard to the approximately 200 microsecond completion time for a typical program command, and the approximately 2 millisecond completion time for a typical erase command. Other pulse durations may be used depending upon the circumstances.

Returning now to FIG. 1, the illustrated PCH 16 has host logic 33 to detect the pulse on the R/B# contact 28 and issue a Read Status Enhanced command to each of the plurality of NAND chips 20 in response to detecting the pulse. Therefore, the PCH 16 may no longer need to poll the NAND chips 20 in order to determine which commands have completed. Such elimination of the polling procedure can provide substantial power savings and performance advantages.

FIG. 2 shows a method 40 of managing flash memory commands. The method 40 may be implemented in fixed-functionality hardware using assembly language programming and circuit technology such as ASIC, complementary metal oxide semiconductor (CMOS) or transistor-transistor logic (TTL) technology, in executable software as a set of logic instructions stored in a machine- or computer-readable medium of a memory such as random access memory (RAM), read only memory (ROM), programmable ROM (PROM), flash memory, firmware, etc., or any combination thereof. Processing block 42 provides for issuing a command to perform an operation on one or more of a plurality of flash memory devices coupled to a Ready/Busy (R/B#) contact of a host device. As already noted, the operation could be a program operation, a read operation, an erase operation, and so on. The command can be received by the flash memory device at block 44, and illustrated block 46 provides for initiating execution of the operation. The R/B# contact may be maintained high at block 48, and illustrated block 50 provides for accessing a status register of the flash memory device.

If it is determined at block 52 that a ready bit of the status register is set and/or has transitioned high, block 54 provides for pulsing the R/B# low. As already noted, the ready bit could be a standard ready bit or an array ready bit that may be used for overlapped interleaving or caching operations. In one example, the pulse has a duration of approximately 100 nanoseconds, which may be significantly less than an execution time of commands to be processed by the flash memory device. Illustrated block 56 provides for detecting the pulse at the host device and Read Status Enhanced commands may be issued to each of the flash memory devices at block 58.

Generally, the NAND chips 20 (FIG. 1) may use floating-gate transistors that are connected in a way that resembles a NAND gate: several transistors are connected in series, and only if all word lines are pulled high (above the transistors' threshold voltage) is the bit pulled low. These groups may then be connected via some additional transistors to a NOR-style bit line array. To read, most of the word lines can be pulled up above the threshold voltage of a programmed bit, while one of them is pulled up to just over the threshold voltage of an erased bit. Thus, the series group may conduct (and pull the bit line low) if the selected bit has not been programmed. Other techniques and transistor configurations for implementing the NAND chips 20 (FIG. 1) may also be used.

Embodiments of the present invention are applicable for use with all types of semiconductor integrated circuit ("IC") chips. Examples of these IC chips include but are not limited to processors, controllers, chipset components, programmable logic arrays (PLA), memory chips, network chips, systems on chip (SoCs), SSD/NAND controller ASICs, and the like. In addition, in some of the drawings, signal conductor lines are represented with lines. Some may be thicker, to indicate more constituent signal paths, have a number label, to indicate a number of constituent signal paths, and/or have arrows at one or more ends, to indicate primary information flow direction. This, however, should not be construed in a limiting manner. Rather, such added detail may be used in connection with one or more exemplary embodiments to facilitate easier understanding of a circuit. Any represented signal lines, whether or not having additional information, may actually comprise one or more signals that may travel in multiple directions and may be implemented with any suitable type of signal scheme, e.g., digital or analog lines implemented with differential pairs, optical fiber lines, and/or single-ended lines.

Example sizes/models/values/ranges may have been given, although embodiments of the present invention are not limited to the same. As manufacturing techniques (e.g., photolithography) mature over time, it is expected that devices of smaller size could be manufactured. In addition, well known power/ground connections to IC chips and other components may or may not be shown within the figures, for simplicity of illustration and discussion, and so as not to obscure certain aspects of the embodiments of the invention. Further, arrangements may be shown in block diagram form in order to avoid obscuring embodiments of the invention, and also in view of the fact that specifics with respect to implementation of such block diagram arrangements are highly dependent upon the platform within which the embodiment is to be implemented, i.e., such specifics should be well within purview of one skilled in the art. Where specific details (e.g., circuits) are set forth in order to describe example embodiments of the invention, it should be apparent to one skilled in the art that embodiments of the invention can be practiced without, or with variation of, these specific details. The description is thus to be regarded as illustrative instead of limiting.

The term "coupled" is used herein to refer to any type of relationship, direct or indirect, between the components in question, and may apply to electrical, mechanical, fluid, optical, electromagnetic, electromechanical or other connections. In addition, the terms "first", "second", etc. are used herein only to facilitate discussion, and carry no particular temporal or chronological significance unless otherwise indicated.

Those skilled in the art will appreciate from the foregoing description that the broad techniques of the embodiments of the present invention can be implemented in a variety of forms. Therefore, while the embodiments of this invention have been described in connection with particular examples thereof, the true scope of the embodiments of the invention should not be so limited since other modifications will become apparent to the skilled practitioner upon a study of the drawings, specification, and following claims.

We claim:

1. A system comprising:
a plurality of NAND memory devices, each NAND memory device having Ready/Busy contact, and memory logic to,
receive a command to execute an operation,
determine that execution of the operation has completed, and
pulse the Ready/Busy contact of the memory device in response to determining that execution of the operation has completed; and
a host device including a Ready/Busy contact coupled to the Ready/Busy contact of each NAND memory device, and host logic to,
detect the pulse on the Ready/Busy contact of the host device, and
issue a read status enhanced command to each of the plurality of NAND memory devices in response to detecting the pulse.

2. The system of claim 1, wherein each memory device further includes a status register, the memory logic to access the status register and pulse the Ready/Busy contact of the memory device if a ready bit of the status register is set.

3. The system of claim 2, wherein the ready bit is an array ready bit.

4. The system of claim wherein the memory logic is to pulse the Ready/Busy contact of the memory device low for approximately 100 nanoseconds.

5. The system of claim 4, wherein the memory logic is to maintain the Ready/Busy contact of the memory device high until execution of the operation has completed.

6. The system of claim 1, wherein the host device is to issue the command to execute the operation.

7. The system of claim 6, wherein the operation includes at least one of a program, read and erase operation.

8. A method of operating a host device comprising:
issuing a command to perform an operation on one or more of a plurality of flash memory devices coupled to a Ready/Busy contact of the host device;
detecting a pulse on the Read/Busy contact of the host device; and
issuing a read status enhanced command to each of the plurality of flash memory devices in response to detecting the pulse.

9. The method of claim 8, wherein the detecting includes detecting a low pulse on the Ready/Busy contact.

10. The method of claim 9, wherein the low pulse has a duration of approximately 100 nanoseconds.

11. The method of claim 8, wherein the flash memory devices include NAND devices and the operation includes at least one of a program, read and erase operation.

* * * * *